United States Patent
Su et al.

(10) Patent No.: US 9,306,012 B2
(45) Date of Patent: Apr. 5, 2016

(54) STRIP-GROUND FIELD PLATE

(71) Applicant: Taiwan Semiconductor Manufacturing Company Limited, Hsin-Chu (TW)

(72) Inventors: Ru-Yi Su, Kouhu Township (TW); Po-Chih Chen, Hsinchu (TW); Ming-Cheng Lin, Yilan (TW); Fu-Chih Yang, Fengshan (TW); Chun Lin Tsai, Hsin-Chu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 13/862,020

(22) Filed: Apr. 12, 2013

(65) Prior Publication Data
US 2014/0264637 A1    Sep. 18, 2014

Related U.S. Application Data

(60) Provisional application No. 61/799,850, filed on Mar. 15, 2013.

(51) Int. Cl.
| | |
|---|---|
| *H01L 29/40* | (2006.01) |
| *H01L 29/66* | (2006.01) |
| *H01L 29/812* | (2006.01) |
| *H01L 29/20* | (2006.01) |

(52) U.S. Cl.
CPC .......... *H01L 29/402* (2013.01); *H01L 29/2003* (2013.01); *H01L 29/401* (2013.01); *H01L 29/404* (2013.01); *H01L 29/66871* (2013.01); *H01L 29/812* (2013.01)

(58) Field of Classification Search
CPC ..................................................... H01L 29/404
USPC ................................................... 257/409, 488
See application file for complete search history.

(56) References Cited

U.S. PATENT DOCUMENTS

| | | | | |
|---|---|---|---|---|
| 6,100,571 | A * | 8/2000 | Mizuta et al. ................. | 257/488 |
| 7,915,644 | B2 * | 3/2011 | Wu et al. ........................ | 257/194 |
| 8,962,462 | B1 * | 2/2015 | Hughes ......................... | 438/572 |
| 2002/0182810 | A1 | 12/2002 | Oh | |
| 2013/0032862 | A1 | 2/2013 | Su et al. | |

* cited by examiner

*Primary Examiner* — Mark Prenty
(74) *Attorney, Agent, or Firm* — Cooper Legal Group, LLC

(57) ABSTRACT

Among other things, one or more semiconductor devices and techniques for forming such semiconductor devices are provided. The semiconductor device comprises a strip-ground field plate. The strip-ground field plate is connected to a source region of the semiconductor device and/or a ground plane. The strip-ground field plate provides a release path for a gate edge electric field. The release path directs an electrical field away from a gate region of the semiconductor device. In this way, breakdown voltage and gate charge are improved.

20 Claims, 9 Drawing Sheets

STRIP-GROUND FIELD PLATE

BACKGROUND

A semiconductor device, such as a transistor, comprises a source region and a drain region. The semiconductor device comprises a channel between the source region and the drain region. A gate region of the semiconductor device is configured to modify the channel when a voltage is applied to the gate region, such that current flows between the source region and drain region such as from the source region to the drain region. A breakdown voltage of the semiconductor device corresponds to a voltage at which the semiconductor will fail. When the semiconductor device is switched on/off, a gate charge, such as a gated edge electric field, can result which can lead to decreased performance of the semiconductor device.

DETAILED DESCRIPTION

Figure 1:
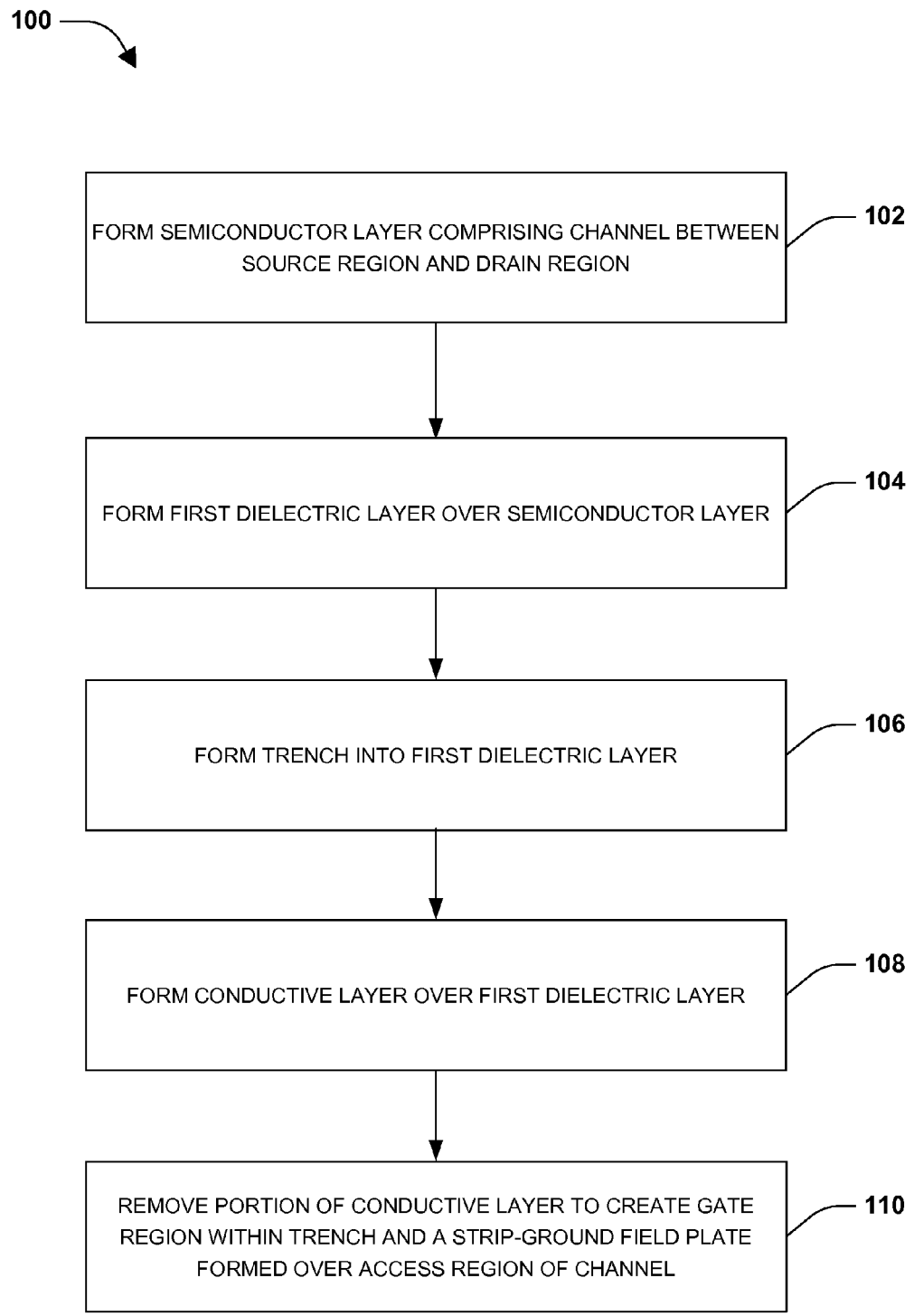
FIG. 1 is a flow diagram illustrating a method of forming a semiconductor device, according to some embodiments.
Figure 2:
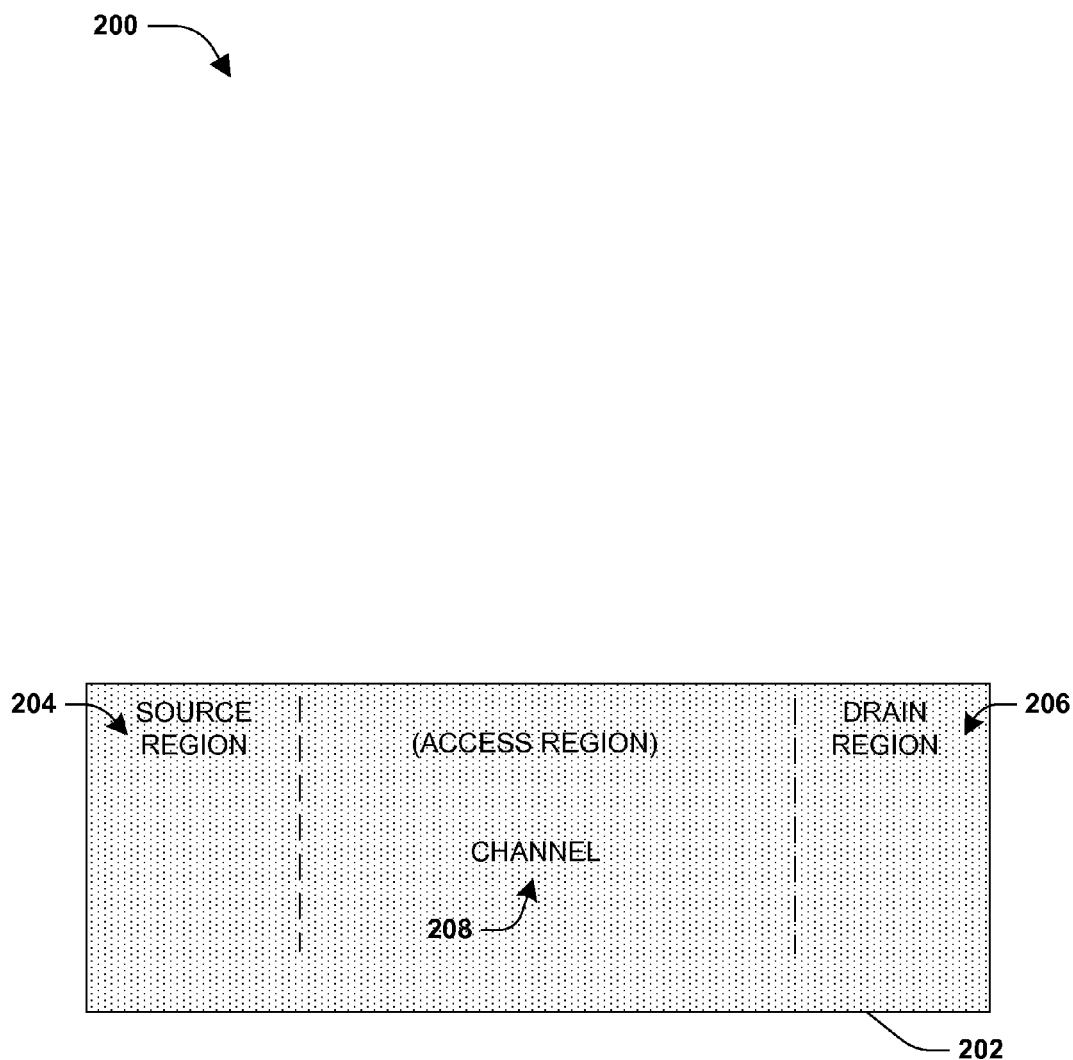
FIG. 2 is an illustration of a semiconductor layer of a semiconductor device, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

As provided herein, a strip-ground field plate is formed within a semiconductor device. The strip-ground field plate, such as a conductive field plate, is connected to a source of the semiconductor device. In some embodiments, the strip-ground field plate is connected to a ground plane, such as a strip ground of a metal one layer or a metal two layer, or a negative voltage. In some embodiments, the gate material comprises a polysilicon material or a metal material. The strip-ground field plate is configured to release a gate edge electric field by providing a release path for the electric field away from the gate region. In this way, a breakdown voltage of the semiconductor device is improved, such as an increase from about 80V to about 130V. A gate charge associated with the semiconductor device is improved, such as a decrease in charge from about 220 nC/cm$^2$ to about 130 nC/cm$^2$. In some embodiments, the strip-ground field plate is fabricated during formation of the gate region, such that the release of the gate edge electric field is layout enabled. In some embodiments, the strip-ground field plate is not connected to the gate region. In some embodiments, a plurality of strip-ground field plates are formed within the semiconductor device, such as over various regions or portions of the semiconductor device (e.g., over a drain region, a channel region, a gate region, an access region, a region between a doped well and a drift region, an isolation structure, etc.). In some embodiments, a strip-ground field plate serves as a terminal of a transistor device (e.g., a gate terminal, a source terminal, etc.). The strip-ground field plate can release or relieve an electrical field in a substrate of the semiconductor device, such as the gate edge electric field or other electrical field. In some embodiments, the strip-ground field plate and the semiconductor device form a high-voltage semiconductor device, such as a high-voltage junction termination device or a gallium nitride (GaN) device.

A method 100 of forming a semiconductor device, according to some embodiments, is illustrated in FIG. 1, and one or more semiconductor devices formed by such a methodology are illustrated in FIGS. 2-9. At 102, a semiconductor layer 202 is formed, as illustrated in example 200 of FIG. 2. The semiconductor layer 202 comprises a source region 204, a drain region 206, and a channel 208 between the source region 204 and the drain region 206. In some embodiments, at least one of the source region 204, the drain region 206, or the channel 208 comprises a semiconductor material, such as gallium nitride (GaN) or other semiconductor material. The channel 208 comprises an access region formed between a gate region (e.g., gate region 702 of FIG. 7), formed over the channel 208, and the drain region 206.

Figure 3:
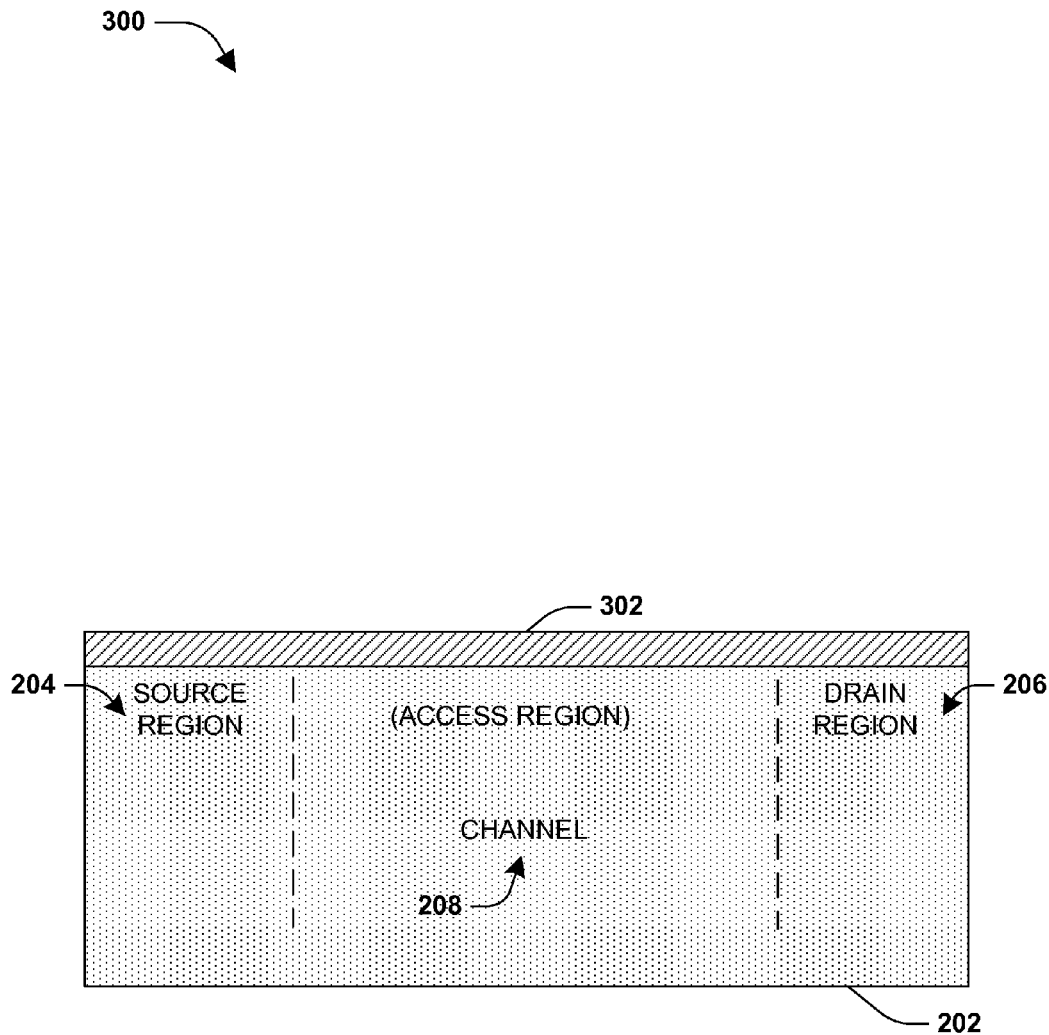
FIG. 3 is an illustration of a first dielectric layer of a semiconductor device, according to some embodiments.
Figure 4:
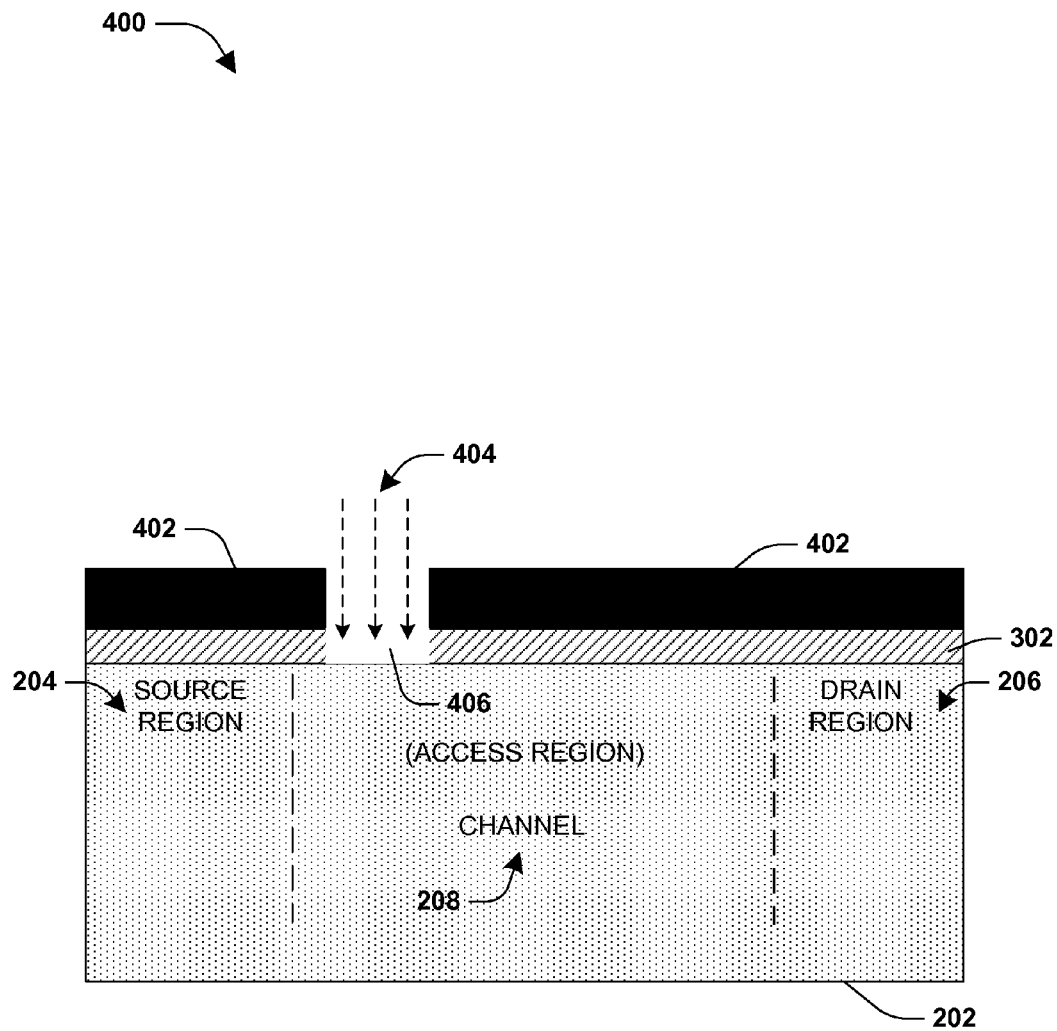
FIG. 4 is an illustration of forming a trench into a first dielectric layer of a semiconductor device, according to some embodiments.

At 104, a first dielectric layer 302 is formed over the semiconductor layer 202, as illustrated in example 300 of FIG. 3. In some embodiments, the dielectric layer 302 comprises a dielectric material, such as silicon nitride (Si3N4) or other dielectric material. In some embodiments, the first dielectric layer 302 is formed between the access region and a strip-ground field plate (e.g., strip-ground field plate 704 of FIG. 7). At 106, a trench 406 is formed into the first dielectric layer 302, as illustrated in example 400 of FIG. 4. In some embodiments, a photoresist 402 is formed over one or more portions of the first dielectric layer 302 such that the one or more portions of the first dielectric layer 302 are not removed by an etching process 404 used to form the trench 406.

Figure 5:
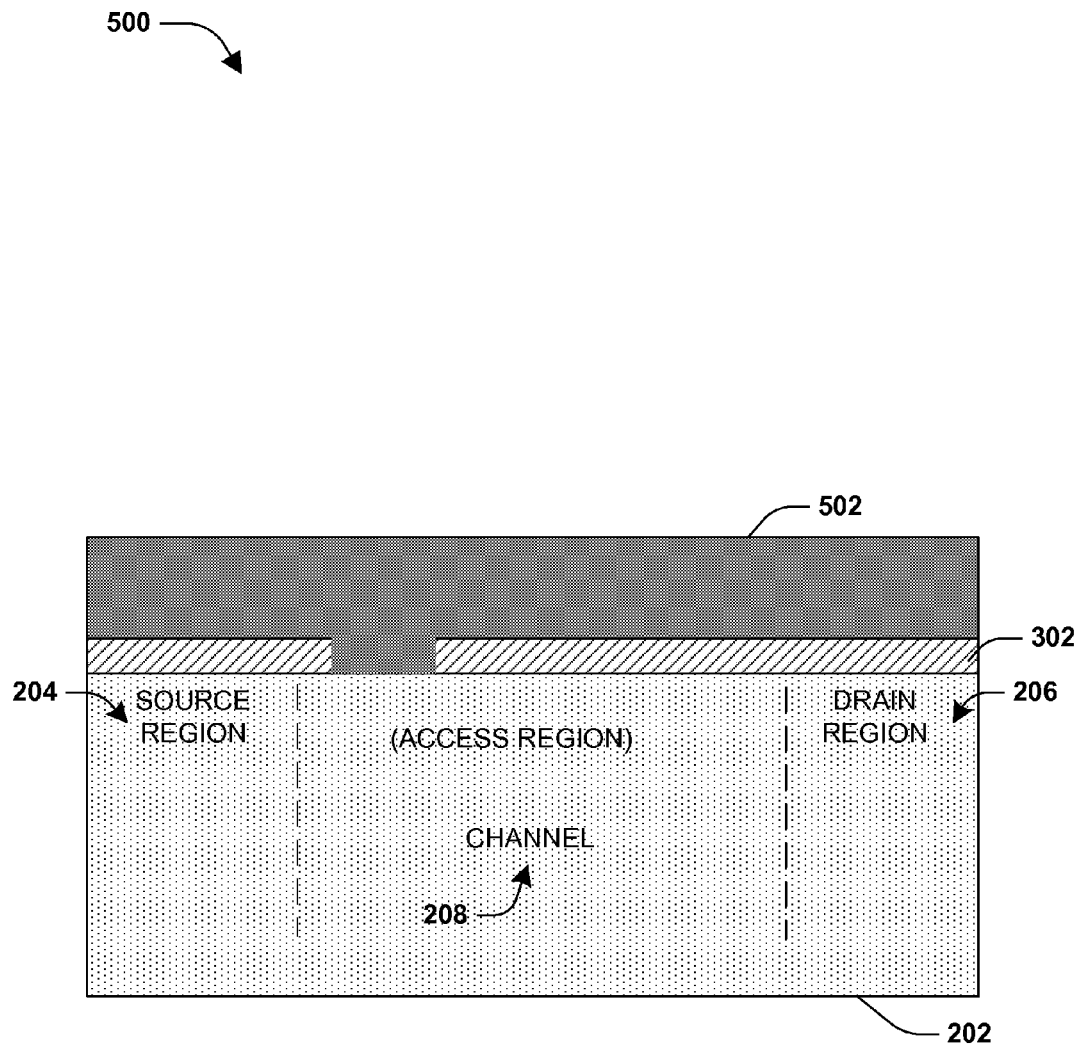
FIG. 5 is an illustration of a conductive layer of a semiconductor device, according to some embodiments.
Figure 6:
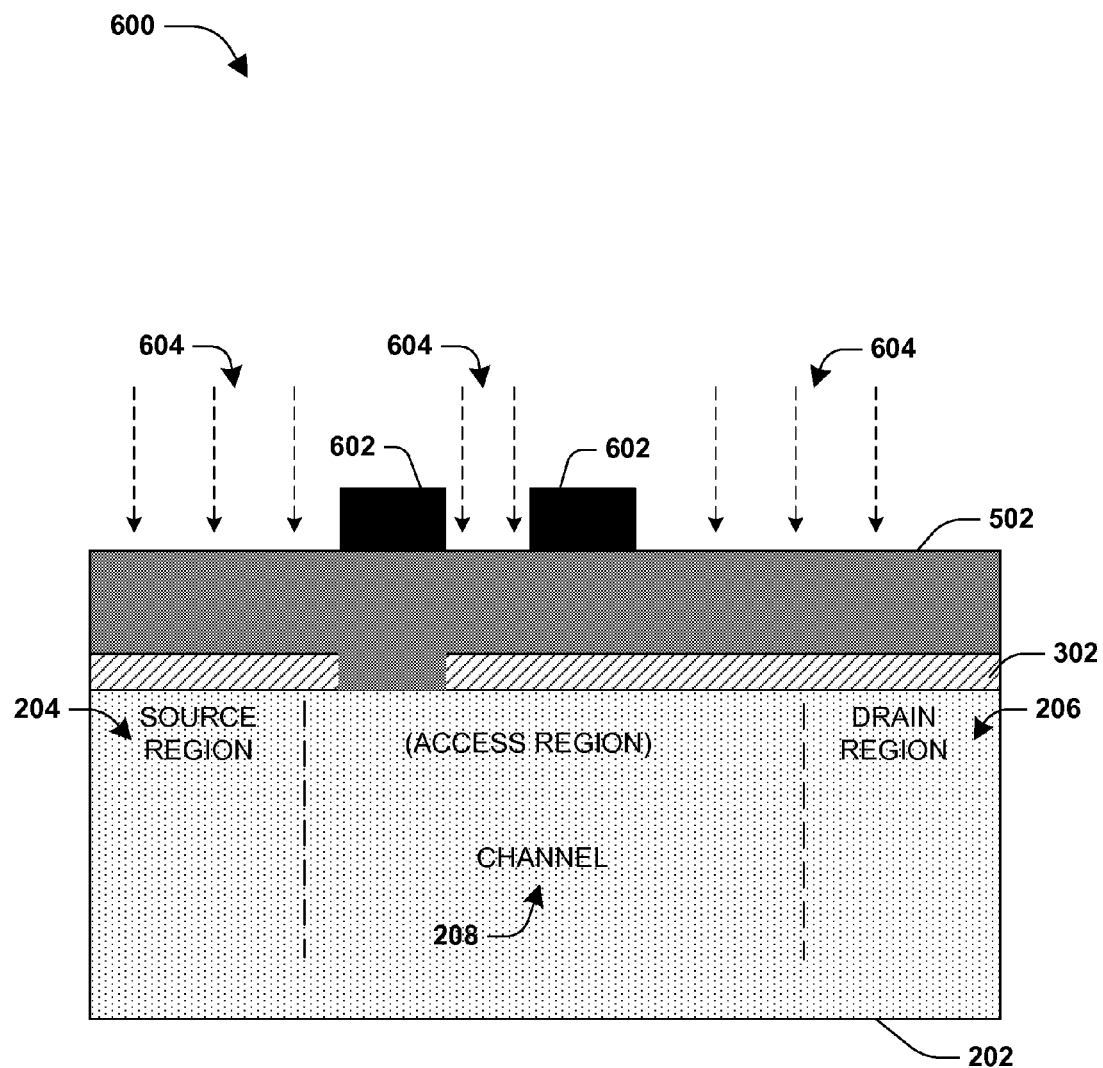
FIG. 6 is an illustration of removing a portion of a conductive layer of a semiconductor device, according to some embodiments.

At 108, a conductive layer 502 is formed over the first dielectric layer 302 and in the trench 406, as illustrated in example 500 of FIG. 5. In some embodiments, the conductive layer 502 comprises a metal material, a semiconductor material, or other conductive material. At 110, a portion of the conductive layer 502 is removed to create a gate region 702 within the trench 406 and to create a strip field plate 704 from a remaining portion of the conductive layer 502, as illustrated in example 600 of FIG. 6 and example 700 of FIG. 7. In some embodiments, a photoresist 602 is formed over one or more portions of the conductive layer 502 such that the one or more portions of the conductive layer 502 (e.g., corresponding to the gate region 702 and the strip-ground field plate) are not removed by an etching process 604 used to remove the portion of the conductive layer 502.

Figure 7:
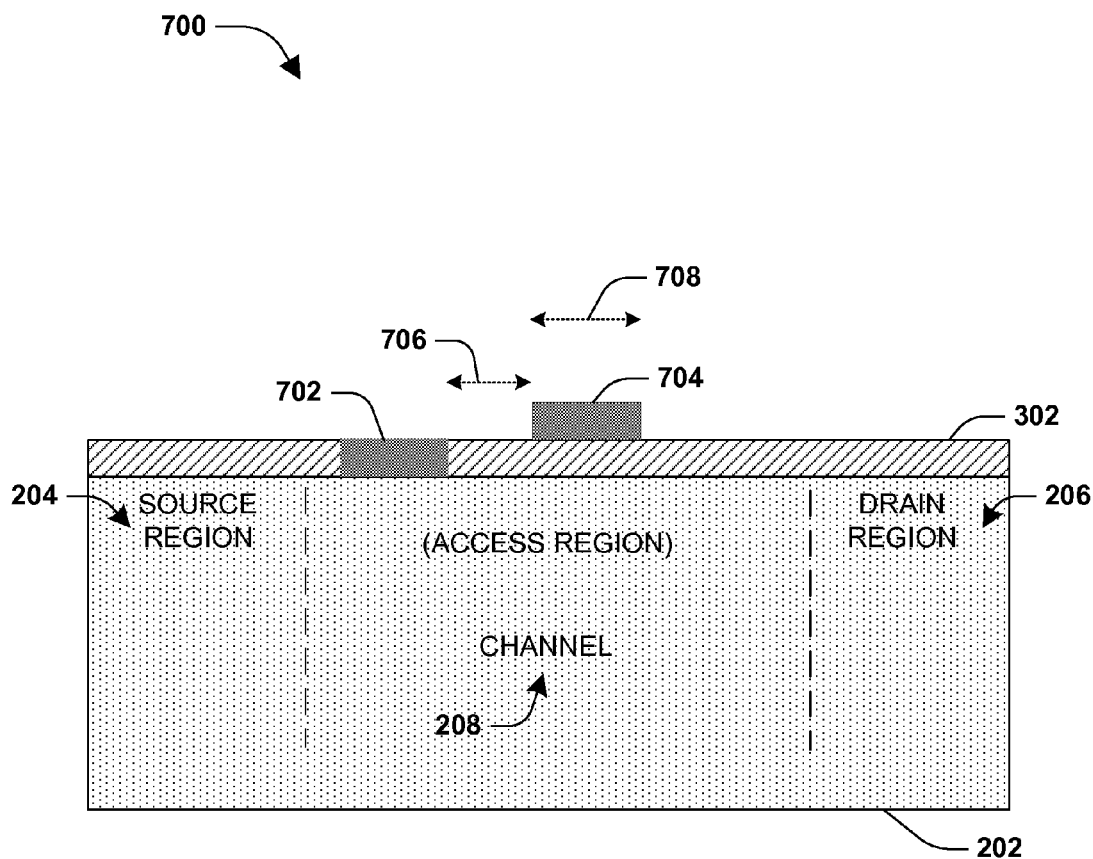
FIG. 7 is an illustration of a semiconductor device, according to some embodiments.
Figure 8:
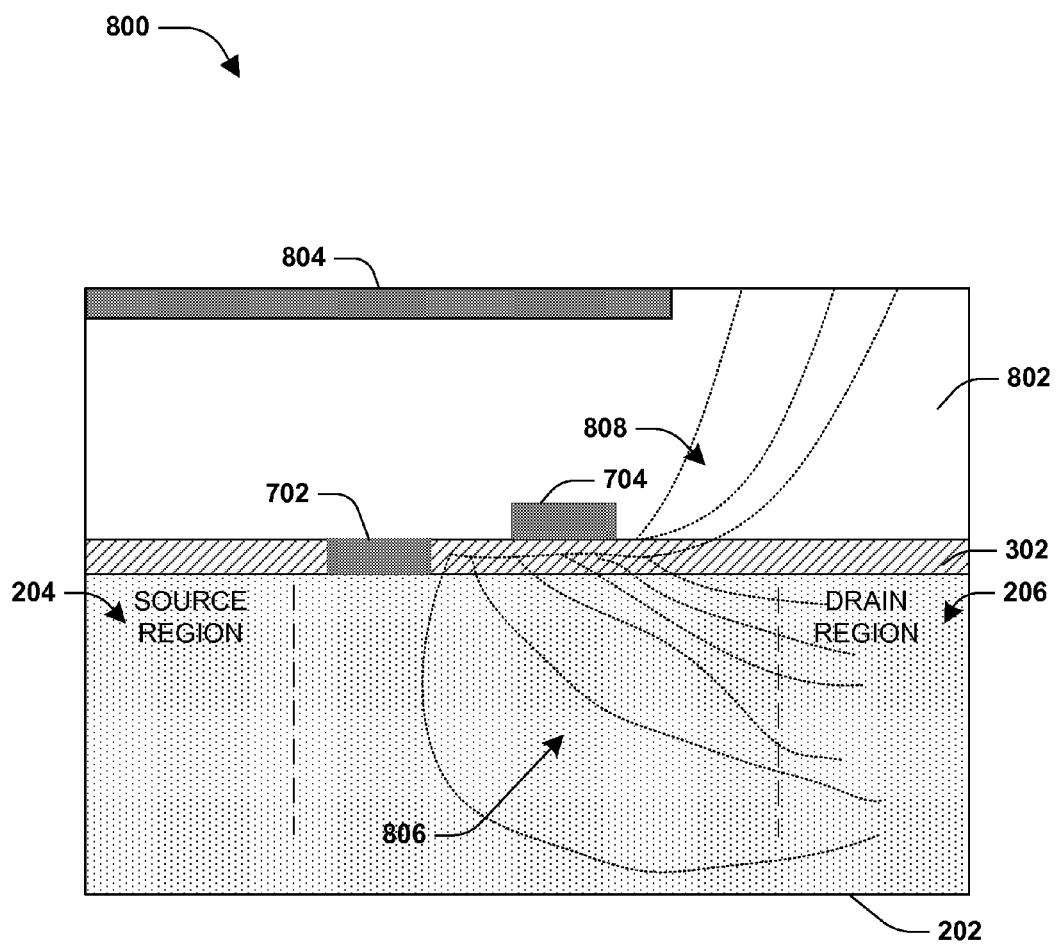
FIG. 8 is an illustration of a strip-ground field plate releasing a gate edge electric field, according to some embodiments.

In some embodiments, the strip-ground field plate 704 is formed over the access region (e.g., a region within the channel 806 between the gate region 702 and the drain region 206), as illustrated in example 700 of FIG. 7. In some embodiments, the strip-ground field plate 704 is not formed over the gate region 702. In some embodiments, the strip-ground field plate 704 is formed over the gate region 702. In some embodiments, the strip-ground field plate 704 is not connected to the gate region 702. In some embodiments, the strip-ground field plate 704 is formed over the first dielectric layer 302 within which the gate region 702 is formed. In some embodiments, the strip-ground field plate 704 is formed between the gate region 702 and the drain region 206. In some embodiments, a distance 706 between the gate region 702 and the strip-ground field plate 704 is about 0.5 um or less, and a width 708 of the strip-ground field plate 704 is about 0.5 um or more.

In some embodiments, the strip-ground field plate 704 is connected to the source region 204 and ground plane, such as a first strip ground of a metal one layer or a second strip ground of a metal two layer. In some embodiments, the strip-ground field plate 704 is configured to provide a release path 808 for a gate electric field 806 based upon being connected to at least one of the source region 204 or the ground plane and/or based upon not being connected to the gate region 702, as illustrated in example 800 of FIG. 8. In an example, the release path 808 is directed substantially away from the gate region 702. In this way, breakdown voltage of the semiconductor device is improved, such as an increase from about 80V to about 130V, and a gate charge associated with the semiconductor device is improved, such as a decrease in charge from about 220 nC/cm$^2$ to about 130 nC/cm$^2$.

In some embodiments, a second dielectric layer 802 is formed over the gate region 702 and the strip-ground field plate 704. In an example, the second dielectric layer 802 comprises a dielectric material, such as silicon oxide (SiO2) or other dielectric material, as illustrated in example 800 of FIG. 8. In some embodiments, the semiconductor device comprises a source field plate 804 that is formed over the second dielectric layer 802. In an example, the source field plate 804 extends over gate region 702 and/or the strip-ground field plate 704.

Figure 9:
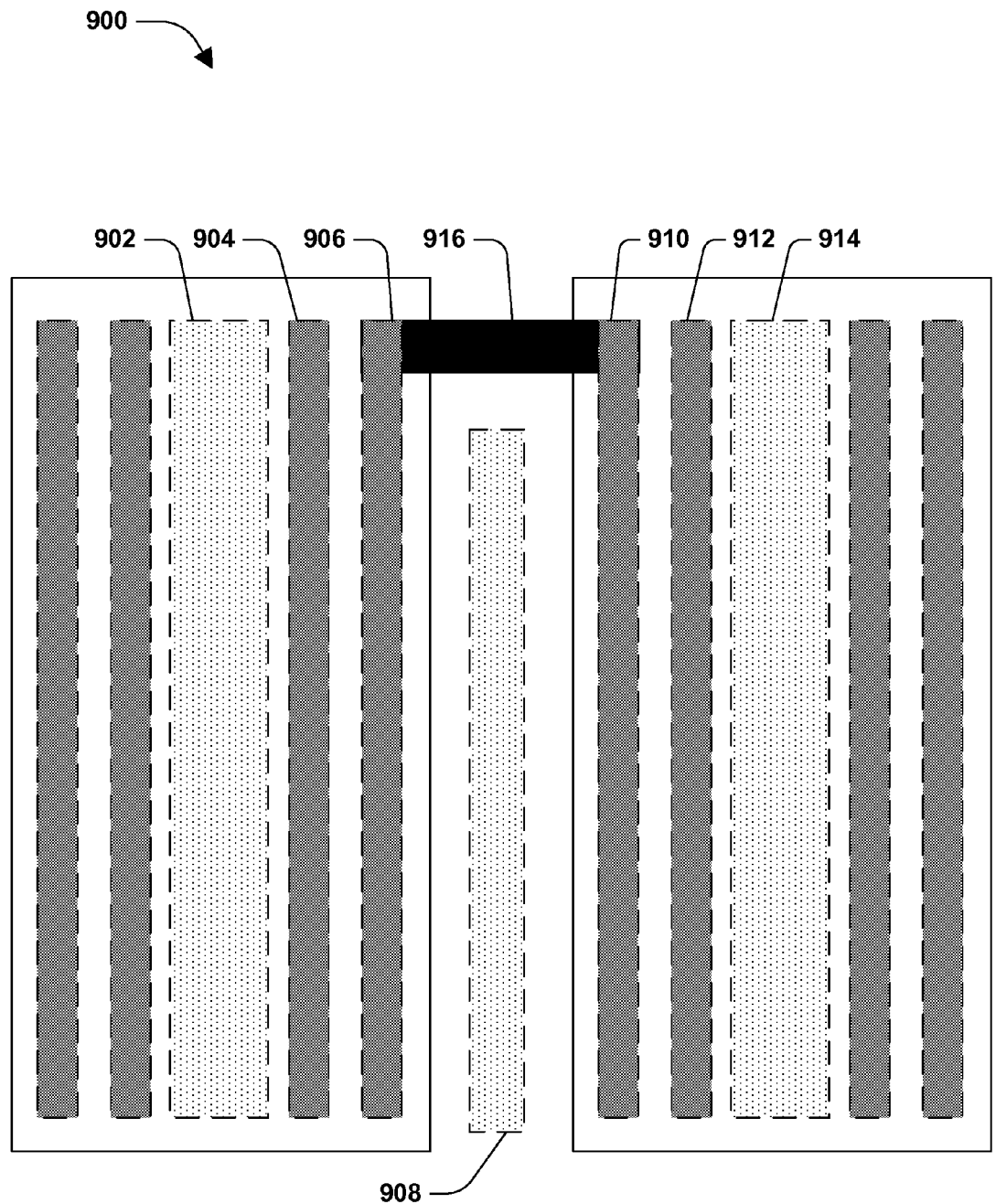
FIG. 9 is an illustration of a semiconductor device, according to some embodiments.

FIG. 9 illustrates an example 900 of one or more semiconductor devices. A first semiconductor device comprises a source region 902, a gate region 904, and a drain region 908. The first semiconductor device comprises a strip-ground field plate 906 that is connected to the source region 902 (connection not illustrated) and/or a ground plane 916. A second semiconductor device comprises a source region 914, a gate region 912, and the drain region 908. The second semiconductor device comprises a strip-ground field plate 910 that is connected to the source region 914 and/or the ground plane 916.

According to an aspect of the instant disclosure, a semiconductor device is disclosed. The semiconductor device comprises a channel between a source region and a drain region. A gate region is formed over the channel. The channel comprises an access region formed between the gate region and the drain region. The semiconductor device comprises a strip-ground field plate formed over the access region. The strip-ground field plate is connected to at least one of the source region or a ground plane.

According to an aspect of the instant disclosure, a method for forming a semiconductor device is disclosed. The method comprises forming a semiconductor layer comprise a channel between a source region and a drain region. A dielectric layer is formed over the semiconductor layer. A trench is formed into the first dielectric layer. A conductive layer is formed over the first dielectric layer. A portion of the conductive layer is removed to create a gate region within the trench and to create a strip-ground field plate from a remaining portion of the conductive layer. The strip-ground field plate is formed over an access region of the channel. The access region is formed between the gate region and the drain region. The strip-ground plate is connected to the source region.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:
1. A semiconductor device, comprising:
a channel between a source region and a drain region of a semiconductor device;
a gate region formed over the channel, the channel comprising an access region formed between the gate region and the drain region;

a strip-ground field plate formed over the access region, the strip-ground field plate connected to at least one of the source region or a ground plane;
a first dielectric layer formed between the strip-ground field plate and the access region;
a second dielectric layer formed over the gate region and the strip-ground field plate; and
a source field plate formed over the second dielectric layer.

2. The semiconductor device of claim 1, the strip-ground field plate configured to provide a release path for a gate edge electric field.

3. The semiconductor device of claim 1, the strip-ground field plate connected to the source region and the ground plane.

4. The semiconductor device of claim 1, the source field plate formed over the source region and at least one of the gate regions or the strip-ground field plate.

5. The semiconductor device of claim 1, the strip-ground field plate corresponding to at least one of a first strip ground of a metal one layer or a second strip ground of a metal two layer.

6. The semiconductor device of claim 1, the strip-ground field plate formed over at least a portion of the gate region.

7. The semiconductor device of claim 1, the gate region having a top surface that is co-planar with a top surface of the first dielectric layer.

8. The semiconductor device of claim 1, the strip-ground field plate not connected to the gate region.

9. The semiconductor device of claim 1, the channel comprising gallium nitride.

10. The semiconductor device of claim 1, the strip-ground field plate comprising a conductive material.

11. The semiconductor device of claim 1, the gate region formed within the first dielectric layer.

12. A semiconductor device, comprising:
a channel between a source region and a drain region of a semiconductor device;
a gate region formed over the channel, the channel comprising an access region formed between the gate region and the drain region; and
a strip-ground field plate connected to the source region and a ground plane, the strip-ground field plate comprising a conductive material configured to provide a path to the ground plane for a gate edge electric field.

13. The semiconductor device of claim 12, the strip-ground field plate formed over the access region.

14. The semiconductor device of claim 12, the strip-ground field plate formed over a first dielectric layer within which the gate region is formed and formed between the gate region and the drain region.

15. The semiconductor device of claim 12, comprising:
a first dielectric layer formed between the strip-ground field plate and the access region; and
a second dielectric layer formed over the gate region and the strip-ground field plate.

16. A semiconductor device, comprising:
a source region;
a drain region separated from the source region by a channel;
a first dielectric layer;
a gate region formed over a first portion of the channel and formed within the first dielectric layer, wherein a top surface of the gate region is substantially coplanar with a top surface of the first dielectric layer;
a strip-ground field plate formed over a second portion of the channel and formed over the first dielectric layer, the strip-ground field plate in contact with the top surface of the first dielectric layer; and
a source field plate formed over the source region and at least one of the gate region or the strip-ground field plate.

17. The semiconductor device of claim 16, the strip-ground field plate configured to provide a release path for a gate electric field, the release path directed away from the gate region.

18. The semiconductor device of claim 17, the strip-ground field plate connected to at least one of the source region or a ground plate to form the release path.

19. The semiconductor device of claim 16, comprising a second dielectric layer formed over the gate region and the strip-ground field plate.

20. A semiconductor device, comprising:
a source region;
a drain region separated from the source region by a channel;
a gate region formed over a first portion of the channel;
a strip-ground field plate formed over a second portion of the channel, the second portion of the channel situated between the first portion of the channel and the drain region; and
a source field plate formed over the source region, the gate region, and the strip-ground field plate.

\* \* \* \* \*